(12) United States Patent
Deguchi et al.

(10) Patent No.: US 6,485,828 B2
(45) Date of Patent: Nov. 26, 2002

(54) FLAT SYNTHETIC FIBER, METHOD FOR PREPARING THE SAME AND NON-WOVEN FABRIC PREPARED USING THE SAME

(75) Inventors: Tomonari Deguchi, Chiba (JP); Tomoyuki Terao, Tokyo (JP); Chitose Yoshimura, Tokyo (JP)

(73) Assignee: Oji Paper Co., Ltd., Tokyo (JP)

( * ) Notice: Subject to any disclaimer, the term of this patent is extended or adjusted under 35 U.S.C. 154(b) by 0 days.

(21) Appl. No.: 09/996,730

(22) Filed: Nov. 30, 2001

(65) Prior Publication Data

US 2002/0106510 A1 Aug. 8, 2002

(30) Foreign Application Priority Data

Dec. 1, 2000 (JP) ........................................ 2000-366765
Jun. 18, 2001 (JP) ........................................ 2001-182713

(51) Int. Cl.$^7$ .................................................. D01F 6/00
(52) U.S. Cl. ........................ 428/364; 428/399; 428/394
(58) Field of Search ............................... 428/364, 394, 428/399; 264/143

(56) References Cited

U.S. PATENT DOCUMENTS

| | | |
|---|---|---|
| 5,223,581 A | 11/1962 | Sommer et al. |
| 5,164,131 A | 11/1992 | Chau et al. |
| 5,171,402 A | 12/1992 | Haines et al. |

FOREIGN PATENT DOCUMENTS

| | | |
|---|---|---|
| EP | 0 445 655 | 9/1991 |
| FR | 1 462 511 | 11/1966 |
| JP | 63-182500 | 7/1988 |
| JP | 6-240596 | 8/1994 |
| WO | WO 92/05300 | 4/1992 |
| WO | WO 95/14815 | 6/1995 |

*Primary Examiner*—Newton Edwards
(74) *Attorney, Agent, or Firm*—Oblon, Spivak, McClelland, Maier & Neustadt, P.C.

(57) ABSTRACT

The present invention provides a partially or whole flat synthetic fiber which is suitably used for preparing a high strength non-woven fabric even if the basis weight is very small, as well as a non-woven fabric prepared using such flat synthetic fibers. According to the present invention, a flat polybenzazole fiber such as PBO fiber is provided which has a flattened portion having a degree of flatness defined by the ratio of the long diameter/the short diameter of the cross section of the fiber being 2 or higher and having a short diameter being 7 μm or less. Also, a partially flat synthetic fiber is provided which has a flattened portion along the longitudinal direction of the fiber, wherein the ratio of Wmax (the maximum fiber width)/Wmin (narrowest fiber width) is 2 or higher or wherein the ratio of Wmax (the maximum fiber width)/Wav (average fiber width) is 1.5 or higher.

20 Claims, 1 Drawing Sheet

FLAT SYNTHETIC FIBER, METHOD FOR PREPARING THE SAME AND NON-WOVEN FABRIC PREPARED USING THE SAME

BACKGROUND OF THE INVENTION

The present invention relates to a flat synthetic resin having a flattened portion or region partially or as a whole through the fiber; and a method for the production of the synthetic fiber. More specifically, the present invention relates to a flat synthetic resin suitably for use in the production of a non-woven fabric having a high strength and good formation even at a low basis weight as well as a simple and efficient method for preparing the flat synthetic resin.

In general, a non-woven fabric is produced by binding a web-like or sheet-like fibrous aggregate, as a base material, with a resin binder (hereunder also simply referred to as "binder") or adhesive fibers or by treating the base material according to the needle punch or water-jet technique to thus make fibers intersect with each other. However, if the product should have a desired strength, the foregoing method, which makes use of a binder or adhesive fibers, in particular, the method of making use of a binder is adopted. In this case, the binder is adhered to the intersection points and fibers are bonded together to thus improve the strength of the resulting non-woven fabric.

Poly(p-phenylene-benzobisoxazole) (hereinafter referred to as "PBO"), oly(p-phenylenebenzobisoxazole), poly(p-phenylenebenzobisthiazole), poly(p-pheynylenebenzobisimidazole), poly(2,5-benzoxazole) and poly(2,6-benzothiazole) are examples of polybenzazoles (hereinafter referred to as "PBZ") or hetero ring-containing polymers. For example, PBO can be obtained by the polymerization reaction of diaminoresorcinol with terephthalic acid in polyphosphoric acid as a solvent. The PBO fiber is prepared by spinning this polymerized dope according to a dry or wet spinning technique, washing the spun product with water and then drying the fiber thus prepared. The fiber shows quite high molecular orientation even at a slight elongation, it can therefore easily take its full length-stretched chain structure, and shows strength and elastic modulus higher than those observed for the carbon fiber. Moreover, it also shows the highest levels of the thermal decomposition temperature and flame retardancy among the existing organic fibers and it has been expected as a super fiber for the next generation and there have been desired for the development of a wide variety of applications of the fiber.

An example of commercially available PBO fibers is ZYLON (available from Toyobo Co., Ltd.) and examples of shapes of the fiber are spun yarns, filaments, staples, chopped fibers and pulp. The term "chopped fiber" used herein means a product obtained by binding continuous fibers in a bundle and then cutting the bundle of the fibers into pieces having a predetermined size and the term "pulp" herein used means a product obtained by beating chopped fibers to thus fibrillate the fibers partially (such as the surface) or completely. It has been intended to use them as friction materials, reinforcing fibers for gaskets and FRP reinforcing fibers. However, it is also possible to form a non-woven fabric using chopped fibers. For instance, Japanese Patent Kokai No. 2000-165000 discloses that the non-woven fabric prepared from PBO fibers will be full of promise as a base material for printed circuit boards.

However, the non-woven fabric of PBZ fibers such as PBO fibers is poor in the working characteristics in, for instance, slitting. Moreover, a laminated board comprising, as a base material, a non-woven fabric of PBZ fibers is poor in the working characteristics, for instance, the suitability for the perforation of the laminated board with laser beams and the suitability for drilling the same. This becomes a cause of a serious problem encountered in, for instance, the processing of a laminated board for printed circuit boards.

As a means for solving the foregoing problems, it would be conceivable to reduce the thickness of such a fabric, while maintaining the basis weight thereof at a low level. In particular, there has recently been desired for reducing the thickness of a printed circuit board in line with the recent trend that electronic machinery and tools are made lighter and smaller. Therefore, there has been an intensive demand for the reduction of the thickness of the non-woven fabric as a base material. However, the reduction in the thickness of a non-woven fabric, while reducing the basis weight thereof, may become a cause of various problems such that the tensile strength of the fabric is reduced, that the fabric has an increased irregularity in the formation thereof, and that the number of pinholes formed in the resulting non-woven fabric increases.

As a means for solving this problem, it may be conceivable to reduce the diameter of the fibers. Such a method permits not only the improvement of the working characteristics of the fibers, but also the augmentation of the number of fibers per unit basis weight, and this would lead to the achievement of effects of reducing the irregularity in the formation and of reducing the number of pinholes formed. Moreover, it would be expected that the strength of the resulting non-woven fabric is improved because of an increase in the relative bonding area. However, the smallest diameter of the chopped fibers presently commercially available is 1.5 d (about 11.6 $\mu$m), but fibers having such a diameter never provides non-woven fabric sufficient in the working characteristics.

Furthermore, it may, Likewise be conceivable to incorporate pulp into such a non-woven fabric, but a large amount of pulp need be incorporated into the non-woven fabric to improve the working characteristics thereof. In this respect, if the amount of the pulp to be incorporated therein is up to about 20%, it shows the effect of improving the strength of the resulting non-woven fabric, but if it is used in an excess amount, the pulp rather becomes a cause of the reduction in the strength and it is apt to generate flocks and this in turn impairs the texture of the resulting fabric.

Recently, there have been proposed a variety of high strength fibers, which have never been experienced conventionally, such as aromatic polyamide fibers (aramid fibers), and ultra high strength polyethylene fibers, polyarylate fibers, as well as polybenzazole (PBZ) fibers such as PBO fibers, and non-woven fabrics produced from such high strength fibers have correspondingly been put on the market. In particular, in the non-woven fabric produced from such fibers having heat-softening properties such as meta-aramid fibers, polyarylate fibers and ultra high molecular weight polyethylene fibers, fibers can be fusion-bonded together by subjecting them to a calendering treatment at a temperature of not less than the softening temperature of the fibers to thus form a non-woven fabric having a very high strength.

In a non-woven fabric prepared using fibers, which are substantially free of heat-softening properties and any self-adhering ability such as para-aramid fibers and polybenzazole (PBZ) such as PBO fibers, however, the strength of the portions bonded using a binder governs the resistance to breakage of the resulting non-woven fabric. More specifically, the strength of the non-woven fabric comprising these fibers as main components is dominated by the bonding strength established by the binder used.

It would be conceivable to simply increase the amount of the binder used as a means for improving the strength of such a non-woven fabric. However, each binder should in general be used in an amount falling within an appropriate range. More specifically, the strength of the resulting non-woven fabric is reduced if the amount is beyond the foregoing appropriate range. Moreover, if the amount of the binder is too large, the resulting non-woven fabric loses the flexibility thereof or it may often lose the desired its quality depending on the applications thereof.

On the other hand, it would also be conceivable to increase the contact area between fibers by flattening the fibers. For instance, Japanese Kokoku No. Hei 6-60035 introduces a glass fiber having a flat cross section. More specifically, it would be expected that the strength of the non-woven fabric can be improved by increasing the contact area between fibers, in case of fibers such as glass fibers, which may be chemically bonded with a binder through a coupling agent, in case of the foregoing fibers having thermally fusion-bonding ability or in case of those having self-adhering properties such as cellulose fibers.

In case of fibers, which do not have an ability of chemically bonding with a binder, a fusion-bonding ability through heat softening and an ability of self-adhesion such as para-aramid fibers and PBZ fibers, however, there is no means for ensuring the bonding strength other than the coverage of the contact points between the fibers with a binder.

SUMMARY OF THE INVENTION

Figure 1:
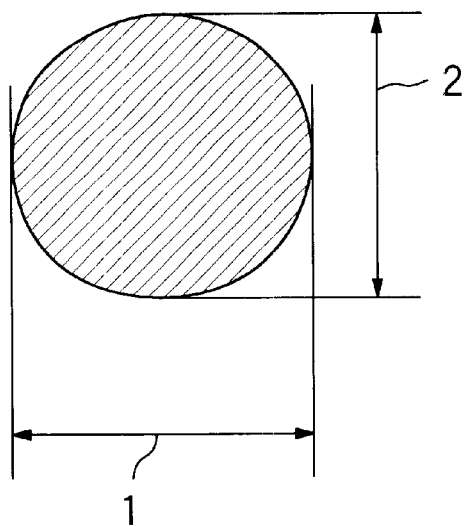
FIG. 1 shows the fiber cross-section of the usual PBO fiber.

It is an object of the present invention to provide a PBZ fiber such as PBO fiber which has a flattened portion partially along or through the longitudinal direction of the fiber and which is excellent in the working characteristics, a non-woven fabric prepared from the PBZ fibers, as well as a method for preparing such a PBO fiber, and more specifically, to provide a PBO fiber having excellent tensile strength and working characteristics when it is used for the preparation of a non-woven fabric and a simple and efficient method for preparing such a fiber at low cost.

It is also an object of the present invention to provide a synthetic fiber which has a flattened portion partially along the longitudinal direction of the fiber and which is suitably used for preparing a non-woven fabric comprising high strength synthetic fibers, in particular, a synthetic fiber such as a para-aramid fiber or a PBZ fiber, which does not substantially undergo heat softening and which is free of any self-adhering ability and which permits the production of a high strength sheet and a non-woven fabric prepared from the synthetic fibers, as well as a simple and efficient method for preparing the foregoing synthetic fiber.

The inventors of this invention have found that a PBZ fiber having a flattened portion partially along or as a whole through the longitudinal direction of the fiber provides the non-woven fabric prepared using the flattened PBZ fibers with an improved tensile strength and working characteristics as compared with those observed for a non-woven fabric formed from the currently used chopped fibers.

The inventors of this invention have also found that synthetic fibers having a partially flattened portion or portions provides the non-woven fabric prepared using such fibers with a considerably improved strength and formation, as compared with those observed for the non-woven fabric prepared from the synthetic fibers having a uniform diameter and no such flattened portion or portions.

The present invention has been completed on the basis of such new and peculiar technical findings.

Specifically, the present invention relates to the following inventions:

1. A flat polybenzazole (PBZ) fiber having a flattened portion having a degree of flatness defined by the ratio of the long diameter/the short diameter of the cross section of the fiber being 2 or higher and having a short diameter being 7 μm or less;
2. A partially flat synthetic fiber having a flattened portion along the longitudinal direction of the fiber, wherein the maximum width of the flattened portion (Wmax) and the narrowest fiber width of said synthetic fiber (Wmin) has the ratio of Wmax/Wmin being 2 or higher; and
3. A partially flat synthetic fiber having a flattened portion along the longitudinal direction of said fiber, wherein the maximum width in the flattened portion (Wmax) and the average width in the lengthwise direction of said synthetic fiber (Wav) has the ratio of Wmax/Wav being not less than 1.5.

DESCRIPTION OF THE PREFERRED EMBODIMENTS

Any synthetic fibers may be used in the present invention. The synthetic fibers include, but not limited to, polyester fibers, polyarylate fibers, polyamide fibers, aromatic polyamide fibers, acrylic fibers, polypropylene fibers, polyvinyl alcohol fibers, polyvinyl chloride fibers, vinylidene fibers, acetate fibers, rayon fibers, polyurethane fibers, polyacrylonitrile (PAN) fibers, polybenzazole (PBZ) fibers such as PBO fibers, polyacetal fibers, polyether ketone (PEK) fibers, polyimide fibers, melamine type fibers, phenolic fibers, fluorine-containing polymer fibers, polyamide-imide fibers, polybenzimidazole (PBI) fibers and polyphenylene sulfide (PPS) fibers; organic-inorganic hybrid fibers such as those obtained by incorporating inorganic materials such as silica into the foregoing synthetic resins; and natural fibers such as vegetable fibers, fibers comprising animal hairs and silk. However, the intended effect of the present invention is in particular conspicuous when using fibers, which do not substantially undergo any heat softening and do not have any self-adhering ability at all, such as para-aramid fibers and polybenzazole fibers.

Figure 2:
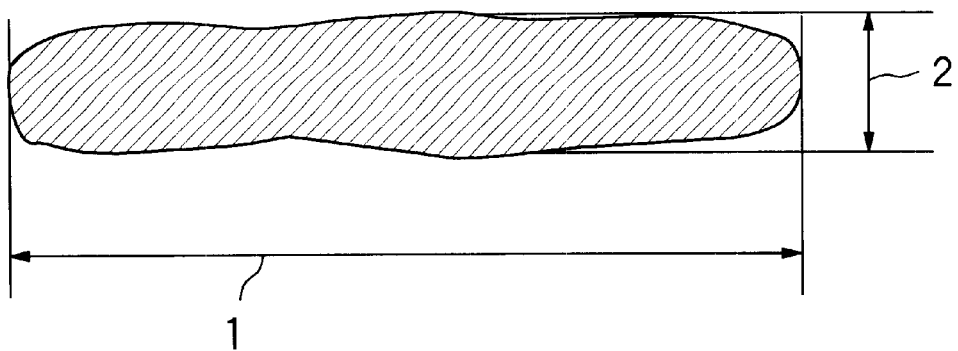
FIG. 2 shows the fiber cross-section of the flat PBO fiber according to FIG. 1.

The typical cross section of the present flat PBZ fiber is shown in FIG. 2. The long diameter is indicated by reference number 1 and the short diameter is indicated by reference number 2. In this connection, FIG. 1 shows the cross section of the original PBO fiber which is used for preparing the present flat PBO fibers. The same reference numbers in FIG. 1 have the corresponding means in FIG. 2.

The term "flat PBZ fiber" used in the present invention means the PBZ fiber whose degree of flatness defined by the ratio: long diameter/short diameter of the cross section of the fiber is 2 or higher, preferably 5 or higher. When the degree of flatness is less than 2, the flat PBZ fiber cannot show the desired effect thereof. On the other hand, when the ratio is too high, the flat PBZ fiber causes curling and it rounds off or is folded up in the worst case. Accordingly, the degree of flatness is preferably 50 or less, much preferably 30 or less.

The short diameter of the flat PBZ fiber is 7 μm or less, preferably 5 μm or less. At present, the finest chopped fibers presently commercially available are those having a denier of about 1.5 (fiber diameter: about 11.6 μm). In addition, when the short diameter of the flat PBZ fiber is 7 μm or less, it has sufficient working characteristics and when it is formed into a non-woven fabric, the number of fiber layers can be increased and the formation of pinholes can effectively be inhibited. The smaller the short diameter of the fiber, the greater the foregoing effect accomplished. On the other hand, when it is too small, the strength of a single fiber is impaired and therefore, the short diameter of the fiber is preferably 0.5 μm or higher, much preferably 1 μm or higher.

The fiber length of the flat PBZ fiber according to the present invention is not particularly limited, but the average fiber length is preferably 1 mm or higher, much preferably 3 mm or higher. This is because, when the fiber length is short and such short fibers are used for preparing a non-woven fabric, the strength of the resulting non-woven fabric is reduced and in particular, when it is less than 1 mm, an inconvenience occurs such that a large quantity of fibers are fallen off through wires upon the wet production of non-woven fabrics.

When a non-woven fabric is produced using the present flat PBZ fibers, the flat faces of the fibers are oriented in the horizontal direction and therefore, the fibers come in contact with one another through face contact. Therefore, the contact area between the fibers increases as compared with those fibers having a circular cross section, which are brought into contact with one another through point contact, and the strength of the resulting non-woven fabric prepared using the present flat fibers is thus improved. Accordingly, the present flat PBZ fibers are preferably used for preparing a non-woven fabric, in particular, a thin non-woven fabric for use in printed circuit boards. Moreover, the present flat PBZ fibers may likewise be used in a variety of applications other than the use thereof as a raw material for non-woven fabrics.

For instance, the flat PBZ fibers are excellent in dispersibility as compared with chopped fibers and pulp if the fiber lengths of these fibers are identical to one another and therefore, the flat PBZ fibers can be blended in a high rate as, for instance, reinforcing fibers for FRP or the like and they can improve the surface smoothness of the resulting product. When they are used in these applications, the reinforcing effect is improved since they can increase the specific area of the fibers and the contact area between the fibers and a resin.

A flat PBZ fiber having a flattened portion partially along or wholly through the longitudinal direction of the fiber can be, for example, prepared by subjecting commercially available PBZ fiber to a sand mill and then recovering the resultant flat PBZ fiber.

The shape of the cross section of the PBZ fibers to be treated with the sand mill may not be particularly limited and those having wide variety of cross sectional shapes may be used in the present invention. Specific examples of such cross sectional shapes are triangular shapes, rectangular shapes, polygonal shapes such as pentagonal or higher, elliptic shapes, oval shapes, eyebrow-like shapes, star shapes, or irregular cross sections having unevenness on the surface. However, it is preferred to use the usual PBZ fibers having circular cross sections, since they can provide partially flat synthetic fibers having a large Wmax/Wmin value through a simple sand mill-treatment.

The sand mills used for preparing the present flat PBZ fibers are those devices in which a stirring machine is inserted into a fixed-container and rotated at a high speed to thus agitate media and PBZ fibers charged into the container.

The sand mills are divided into the following two groups: vertical and horizontal type ones, but both of them can be used for preparing the present flat PBZ fibers. Specific examples thereof are those named Sand Grinder, Dynomill and Ultraviscomill.

Examples of the media to be used in the container of the sand mill include, but are not limited to, inorganic beads such as glass beads, alumina beads, zirconia beads, zircon beads, steal beads and titania beads; beads obtained by coating these inorganic beads with organic materials; and organic beads such as nylon beads and Teflon beads. These beads may be used alone or in any combination of at least two of them.

The average particle size of the media usable in the present invention extends from a very small value on the order of about 0.1 mm to a large value on the order of about 6 mm. The degree of flatness can be controlled by appropriately selecting various processing conditions such as the kinds and materials as well as the average particle size of these media, the rate of rotations of the sand mill, the concentration of the fibers to be treated and the processing time.

The amount of the media to be charged into the container of a sand mill preferably ranges from 50 to 90% and in particular 60 to 85% of the amount corresponding to the closest packing. When the packing density is too low, the so-called short pass occurs. In the short pass, the treated PBZ fibers are discharged from the container before they are sufficiently treated to a desired degree. On the other hand, the higher the packing density, the higher the processing efficiency, but when the packing density is too high, a problem arises such that the PBZ fibers never pass through the sand mill easily in case of the continuous processing.

The PBZ fibers to be used for preparing the present flat PBZ fibers may be in any form of PBZ fibers. However, the chopped fibers of PBZ fibers may be convenient to be used, because they are commercially available.

The fiber diameter of the PBZ chopped fibers to be treated by the sand mill is appropriately selected in such a manner that it has a cross section corresponding to that of the resultant flat PBZ fibers. The cross section of the flat fiber can be determined by the degree of flatness and the short diameter thereof. For instance, when a flat PBZ fiber having a degree of flatness of 2 and a short diameter of 7 μm is intended to be prepared, it is suitable that chopped fibers each having a fiber diameter of about 11 μm should be used as a starting material.

When the fiber length of the PBZ chopped fibers to be used is too large, problems arise such that the dispersibility thereof in a suspension as will be detailed later is impaired and that the fibers are entangled with each other during the treatment in a sand mill. Therefore, the fiber length is usually 20 mm or smaller, preferably 10 mm or smaller, much preferably 6 mm or smaller. The minimum fiber length of the starting PBO fibers may be suitably at 1 μmm.

When PBZ fibers are treated in a sand mill, the PBZ chopped fibers are dispersed in a medium to give a slurry prior to the sand mill treatment. As the medium of the dispersion, water is in general most suitably used because of its easy handling ability and wide use, but it is also possible to use an organic solvent such as methanol and ethanol and mixed solvents such as mixtures of these organic solvents with water for special purposes such as applications in which the use of water should be avoided. Moreover, the dispersion may comprise, for instance, a dispersant to improve the dispersibility of fibers in a medium selected.

In the sand mill-treatment, the PBZ fiber content of the suspension is in general adjusted to the range of from 0.1 to 5.0% by weight. This is because if the solid content is less than 0.1% by weight, the processing efficiency may be too low, while if it exceeds 5.0% by weight, problems may arise such that the treatment is insufficient, that the sample cannot easily pass through the mill and that fibers are entangled with each other. Therefore, the PBZ fiber content is desirably controlled to the range of from 0.3 to 2.0% by weight, while taking into consideration the processing efficiency.

The processing method used in the treatment in a sand mill is not likewise limited to any specific one and either the batchwise or continuous method may be used, with the continuous method being preferred if the production efficiency is regarded as of major importance. In case of the continuous method, the retention time (processing time) can be controlled by changing the flow rate of the fibers to be fed into the sand mill. In addition, several devices are connected in series to thus treat the fibers.

The basis weight of the resultant non-woven PBZ fabric may be suitably 5 to 40 g/cm$^2$, preferably 8 to 30 g/cm$^2$.

A resin binder can be applied onto a non-woven fabric formed into a sheet. Such a resin binder is not restricted to any specific one and examples thereof widely used herein include epoxy resins, phenol resins, melamine resins, polyimide resins, polyamide-imide resins, acrylic resins and silicone resins. At least one of these resin binders may appropriately be selected depending on the intended applications.

The method for applying a resin binder to a non-woven fabric may be, for instance, a method comprising the step of spraying the resin binder on a non-woven fabric, a method comprising the step of immersing a non-woven fabric in a resin binder solution and a method comprising the step of coating a non-woven fabric with a resin binder solution, or at least two of these methods may be combined. After the application of the resin binder, the non-woven fabric impregnated the resin binder is dried with heating by hot air or a drum dryer, to thus cure the resin binder. The resin binder may be applied onto the non-woven fabric in the on-machine or off-machine mode.

The resin is usually used in an amount of 3 to 35 wt. %, preferably 5 to 25 wt. % on the basis of the non-woven fabric.

It is preferred to subject the non-woven fabric thus prepared to a calendering treatment. The temperature, linear pressure and speed of the calender are appropriately selected depending on the intended thickness (density) of the non-woven fabric to be formed.

As another feature of the present invention, the synthetic fiber having a flattened portion (or region) or portions (or regions) along the longitudinal direction of the fiber is provided.

The partially flat synthetic fiber according to the present invention is characterized in that, as a result of flattening of a starting synthetic fiber in the lengthwise direction thereof, it has flat portions whose width is larger than the diameter of the starting synthetic fiber at one or more portions on the fiber. If a non-woven fabric is prepared from such synthetic fibers, the resulting non-woven fabric has a considerably improved strength as compared with that observed for the non-woven fabric using the usual synthetic fibers. The correct reason of this will be elucidated by the future researches, but one of the reasons would be as follows: the flattened portions or regions on the fibers intersecting with each other serve as hooking portions to thus generate a strong resistance, upon pulling the fabric. In addition, it is considered that, since the flat synthetic fibers easily fold at the flattened portion or portions, the fibers are entangled with each other. In this case, the fibers in the non-woven fabric which is prepared using such fibers function as where the fibers having the length defined between two flattened portions are contained in the fabric and therefore the formation of the fabric is improved.

The partially flat synthetic fiber according to the present invention has a flattened or wide portion or portions. In this connection, when the maximum fiber width in the flattened or wide portion is defined to be Wmax and the narrowest fiber width of the unflattened or starting portion of the synthetic fiber is defined to be Wmin, the ratio: Wmax/Wmin is 2 or larger, preferably 2.5 or larger. The maximum ratio may be suitably, for example, 5.0. In other words, it is preferred that the flat synthetic fiber should have at least one portion whose width is exceptionally large. If the foregoing ratio is less than 2.0, the hooking action existing between the flattened portions is weak and the strength-improving effect thereof is correspondingly insufficient. On the other hand, when the ratio exceeds 5.0, the thickness of the flattened region may be reduced and the strength of the fiber in the flattened region likewise may become insufficient.

According to the partially flat synthetic fiber of the present invention, even when the synthetic fiber is flattened evenly through the whole fiber, the intended effect of the present invention can be accomplished inasmuch as there are protruded portions such that the ratio of the maximum width (Wmax) in the flattened portion to the average width (Wav) of the fiber is 1.5 or larger, preferably 2 or higher. In addition, the maximum ratio may be suitably 5.0 for the same reason as that discussed above.

In case of the partially flat synthetic fiber according to the present invention, it is particularly preferred that the foregoing value Wmin corresponds to the width of the narrowest, unflattened portion of the original fiber or an unflattened portion is present on at least part of the synthetic fiber, since the value: Wmax/Wmin becomes large and the strength of the fiber is only slightly reduced.

For this reason, in the partially flattened synthetic fiber of the present invention, the flattening rate expressed in terms of the ratio: L1/L2 ranges, for example, from 0.05 to 0.5, preferably from 0.1 to 0.4, wherein the overall fiber length is defined to be L1 and the total length of the portions in which the fiber is flattened is defined to be L2. In case where the foregoing flattening ratio is less than 0.05 and it exceeds 0.5, the hooking action existing between the flattened portions may be weak and the strength-improving effect thereof may be accordingly insufficient.

The partially flat synthetic fibers may be prepared in the same manner as the flat PBZ fibers as stated above, using the sand mill and the sand mill conditions as generally used for preparing the flat PBZ fibers.

In the same manner as the preparation of the flat PBZ fibers, the average particle size of the beads to be used for the sand mill treatment extends from a very small value on the order of about 0.1 mm to a large value on the order of about 6 mm. The degree of flatness of a fiber can be controlled by appropriately selecting various processing conditions such as the kinds and materials as well as the average particle size of these media, the frequency rate of the sand mill, the concentration of the fibers to be treated and the processing time. The particle size of the beads particularly preferably used for the flattening ranges from about 0.2 to 3 times the average length of the fiber.

The amount of the media to be charged into the container of the sand mill preferably ranges from 40 to 80% and in particular 50 to 70% of the volume of the container. If the packing density is too low, the so-called short pass occurs. In the short pass, a sample is discharged from the container before they are not treated at all. On the other hand, if the packing density is too high, a problem arises such that the fibers are excessively flattened and the rate of the unflattened region is reduced.

The intended effect of the present invention is in particular conspicuous when using synthetic fibers, which do not substantially undergo any heat softening and do not have any self-adhering ability at all, such as para-aramid fibers and polybenzazole fibers.

For example, non-woven fabrics containing para-aramid fibers (such as poly(p-phenylene-telephthalamide) and co-poly(p-phenylene/3,4'-diphenylether-telephtalamide) fibers) and polybenzazole fibers are now considered as very useful for base materials for laminated boards for the applications such as printed circuit boards. In addition, due to the demand for making electronic appliances light and small, the non-woven fabric for such laminated boards are demanded to be thin (or lower basis weight). The present partially flat synthetic fibers can produce non-woven fabrics which are thin and having improved strength and formation. Therefore, these flat synthetic fibers are very suitable for preparing non-woven fabrics for laminated boards.

The diameter (denier) of the synthetic fibers to be used for preparing the present partially flat synthetic fibers is not particularly limited, but the fiber diameter is preferably smaller, since the intended effect of the invention is to improve the strength of the resulting non-woven fabric. In other words, the smaller the diameter of the synthetic fiber, the greater the number of synthetic fibers present in the resultant non-woven fabric per unit basis weight and the higher the number of intersection points between the synthetic fibers. Therefore, the improvement of the strength of the resulting fabric would be expected. In this respect, however, if the fiber diameter is too small, problems may arise such that fibers are broken during the sand mill-treatment and that the strength of the fiber per se is reduced. Accordingly, the fibers used in the present invention have a diameter ranging from 0.1 to 5 deniers and more preferably about 0.5 to 2 deniers. In this connection, the fibers may comprise a mixture of fibers having different diameters.

When the length of the fiber is too long, problems may arise such that the dispersibility thereof in a suspension as will be detailed later is impaired and that the fibers are entangled with each other during the treatment in a sand mill. Therefore, the fiber length is preferably 20 mm or shorter, more preferably 10 mm or shorter, and further preferably 6 mm or shorter. The minimum fiber length may be suitably, for example, 1 mm. The fibers may comprise a mixture of fibers having different lengths.

The shape of the cross section of the synthetic fibers to be treated with the sand mill may not be particularly limited and those having wide variety of cross sectional shapes may be used in the present invention. Specific examples of such cross sectional shapes are triangular shapes, rectangular shapes, polygonal shapes such as pentagonal or higher, elliptic shapes, oval shapes, eyebrow-like shapes, star shapes, or irregular cross sections having unevenness on the surface. However, it is preferred to use the usual synthetic fibers having circular cross sections, since they can provide partially flat synthetic fibers having a large Wmax/Wmin value through a simple sand mill-treatment.

The feed or starting synthetic fibers are suitably dispersed in a medium to give a slurry prior to the treatment with the sand mill. As the medium, water is in general most suitably used because of its easy handling ability and the ability of wide use, but it is also possible to use an organic solvent such as methanol and ethanol and mixed solvents such as mixtures of these organic solvents with water for special purposes such as applications in which the use of water should be avoided. Moreover, the dispersion may comprise; for instance, a dispersant and/or a viscosity-adjusting agent to improve the dispersibility of fibers in a medium selected.

In the sand mill-treatment, the fiber content in the aqueous suspension of organic fibers is in general adjusted to the range of from 0.1 to 5.0% by weight. This is because if the fiber content is less than 0.1% by weight, the processing efficiency is very low, while if it exceeds 5.0% by weight, problems arise such that the sample cannot easily pass through the mill and that fibers are entangled with each other. Therefore, the fibers are preferably subjected to the flattening treatment under the following conditions: a fiber concentration ranging from 0.3 to 2.0% by weight; a beads-packing rate of 40 to 70%; a fiber length of 1 to 10 mm; a processing time (retention time) of 1 to 10 minutes; peripheral speed of 5 to 20 m/sec, while taking into consideration the processing efficiency. In this respect, the term "retention time" herein used means the value obtained by dividing the vessel's actual space (vessel's volume—beads volume) in the continuous processing by the flow rate of the fiber slurry.

The processing method used in the treatment in a sand mill is not likewise limited to any specific one and either the batchwise or continuous method may be used, with the continuous method being preferred if the production efficiency is regarded as of major importance. In case of the continuous method, the retention time (processing time) can be controlled by changing the flow rate of the synthetic fibers fed to the sand mill. In addition, several devices are connected in series to thus treat the fibers.

The partially flat synthetic fibers thus prepared are used for the production of a non-woven fabric. The method for preparing a non-woven fabric is not restricted to any specific one and either a dry method or a wet method may be used, but the wet method is preferably adopted to obtain a non-woven fabric having a high density and good texture. In addition, fibers free of any partial flattening treatment may be incorporated into the non-woven fabric in an amount, which never impairs the intended effect of the present invention and auxiliary fibers such as pulp and/or fibrids may likewise be used.

The basis weight of the resultant non-woven fabric may be suitably 5 to 40 $g/cm^2$, preferably 8 to 30 $g/cm^2$.

As in the same manner as the preparation of the impregnated non-woven fabric using the flat PBZ fibers, a resin binder may be applied onto a non-woven fabric formed from the partially flat synthetic fibers into a sheet. Such a resin binder is not restricted to any specific one and examples thereof widely used herein include epoxy resins, phenol resins, melamine resins, polyimide resins, polyamide-imide resins, acrylic resins and silicone resins. At least one of these resin binders may appropriately be selected depending on the intended applications.

The method for applying a resin binder to a non-woven fabric may be, for instance, a method comprising the step of spraying the resin binder on a non-woven fabric, a method comprising the step of immersing a non-woven fabric in a resin binder solution and a method comprising the step of coating a non-woven fabric with a resin binder solution, or at least two of these methods may be combined. After the application of the resin binder, the non-woven fabric is dried with heating by hot air or a drum dryer to thus cure the resin binder. The resin binder may be applied onto the non-woven fabric in the on-machine or off-machine mode.

The resin is usually used in an amount of 3 to 35 wt. %, preferably 5 to 25 wt. % on the basis of the non-woven fabric.

It is preferred to subject the non-woven fabric thus prepared to a calendering treatment. The temperature, linear pressure and speed of the calender are appropriately selected depending on the intended thickness (density) of the non-woven fabric to be formed.

EXAMPLE

The present invention will hereunder be described more in detail with reference to the following Examples and Reference Examples, but the scope of the present invention is not restricted to these specific Examples and Reference Examples, at all. In the following Examples and Reference Examples, the term "%" means "% by weight", unless otherwise specified.

The maximum fiber width, average fiber width, flattening rate and tensile strength (breaking length) of the resultant non-woven fabric were determined according to the following methods:

Determination of Degree of Flatness

A fiber was straightened and lightly pressed on an adhesive tape to thus adhere the fiber to the adhesive tape such that the flat face thereof was adhered closely thereto and the resulting assembly was embedded in an epoxy resin. After curing the resin, it was cut along the longitudinal direction and the vertical direction of the fiber using a microtome equipped with a diamond knife to form the sections along the both directions and an optical micrograph of the fiber cross section was taken using an optical microscope (an optical microscopic image). Then, as shown in FIG. 2, the maximum length of the fiber was determined in the cross section and the short length of the fiber was determined as the length which vertically intersects the long diameter at the center of the long diameter. The degree of flatness defined by the following equation was calculated using these long and short diameters. In this respect, the degree of flatness of a fiber having a circular cross section is calculated as 1.

Degree of Flatness=Long Diameter/Short Diameter

In this evaluation, the degree of flatness was measured using 50 fibers and the average of these 50 measurements was herein used as the degree of flatness of each fiber.

Determination of Maximum Fiber Width, Average Fiber Width and Rate of Flattening A fiber was straightened and lightly pressed onto an adhesive tape to thus adhere the fiber to the adhesive tape such that the flat face thereof was adhered closely thereto and the resulting assembly was attached to a glass plate and a plane (or surface) photograph was taken using a microscope. The photograph was enlarged and each fiber width was determined using a slide gauge. The maximum fiber width of the flattened portion is defined to be Wmax and the narrowest fiber width of the portion free of any flattening on the original fiber is defined to be Wmin.

The average fiber width (Wav) was determined by measuring the widths of 5 points on a fiber, more specifically the widths at the both ends of a fiber and 3 points arranged between the ends and in equal intervals, repeating the determination of the foregoing widths for 10 fibers and calculating an average width of 10 fibers.

The flattening rate is defined to be a value (L2/L1) obtained by dividing the overall length (L2) of the flattened wider portions arranged on a fiber in its lengthwise direction by the whole length (L1) of the fiber.

Tensile Strength of Non-woven Fabric (kgf/5 mm)

A rectangular piece having a width of 30 mm and a length of 150 mm was cut out from each non-woven fabric and the tensile strength of the piece was determined under the following conditions: a span of 100 mm and a rate of pulling of 10 mm/min. The tensile strength was measured at 10 points each on the fiber to thus calculate the average value.

Formation of Non-woven Fabric

The formation of each non-woven fabric was evaluated by observing the light rays transmitted through the fabric with the naked eyes. This was evaluated according to the following criteria:

○: There was observed only a slight unevenness in the light and shade and the number of pinholes was also small.

Δ: There were observed unevenness in the light and shade and/or the presence of pinholes, but the sheet was found to be good on the whole.

×: There were observed a high degree of unevenness in the light and shade and/or a large number of pinholes and therefore, the sheet was unacceptable.

Working Characteristics of Non-woven Fabric

A roll comprising 500 m of each non-woven fabric was divided into two portions using a slitter, the sections cut by the slitter for every 100 mm of the fabric were observed and the working characteristics of each fabric was evaluated according to the following criteria:

○: The non-woven fabric was cut without causing any fluffing.

Δ: A slight fluffing was observed on the sections, but the non-woven fabric was good on the whole.

×: Serious fluffing was observed on the sections and therefore, the non-woven fabric was insufficient in the working characteristics.

Example 1

PBO Chopped fibers (trade name: ZYLON HM, fiber diameter: 1.5 d, degree of flatness: 1, available from Toyobo Co., Ltd.) having a length of 3.0 mm were dispersed in water to form a slurry having a PBO fiber content of 1.0%. Then, the slurry was introduced into a 206 L volume sand mill (RL250H available from Ashizawa Co., Ltd.), to which alumina beads having an average particle size of 3 mm had been charged in a packing rate of 78% (with respect to the closest packing amount), at a flow rate of 15 L/min to thus treat the slurry at a rotational frequency of 552 rpm. At this stage, the processing temperature was set at a level of 30° C. by adjusting the temperature of the circulating water for cooling. The degree of flatness of the fibers after the treatment was found to be 19.8; the short diameter thereof was found to be 2.3 gm; and the fiber length was found to be 3 mm.

The PBO fibers obtained after the treatment were formed into a sheet according to a wet method using an inclined paper-making machine in such a manner that the basis weight of the sheet was equal to 17.5 g/m². An emulsion of a thermosetting epoxy resin was added to this sheet according to the on-machine spraying method such that the content thereof in the resulting impregnated non-woven fabric after drying the same was equal to 30%, followed by drying the same by heating.

Then, an intended final non-woven fabric was prepared by treating the foregoing product in a hot calender having a roll temperature of 200° C. such that the density of the non-woven fabric was reduced to a level of 0.65 g/cm .

Example 2

The same procedures used in Example 1 were repeated except that the packing rate of the alumina beads was changed to 72% to treat the fibers in the sand mill. As a result, it was found that the degree of flatness of the fibers obtained after the sand mill treatment was 2.8; and that the short diameter thereof was 6.2 μm; and that the fiber length was found to be 3 mm. Then, the same procedures used in Example 1 were repeated using the resulting fibers to thus obtain a final non-woven fabric.

Comparative Example 1

The same procedures used in Example 1 were repeated except that the concentration of the PBO chopped fibers in the slurry used in Example 1 was changed to 0.1% and that the flow rate of the slurry was set at 30 L/min to thus treat the fibers in the sand mill. As a result, it was found that the degree of flatness of the fibers obtained after the treatment was 1.8; that the short diameter thereof was 7.6 μm; and the fiber length was found to be 3 mm. The same procedures used in Example 1 were repeated using the resulting fibers to thus obtain a final non-woven fabric.

Comparative Example 2

The same procedures used in Example 1 were repeated except that the treatment in the sand mill was omitted to thus obtain a final non-woven fabric.

Comparative Example 3

The same procedures used in Example 1 were repeated except for using a slurry obtained by mixing 80 parts of PBO chopped fibers having a fiber length of 3.0 mm and 20 parts of PBO pulp (available from Toyobo Co., Ltd.) to thus give a final non-woven fabric.

Comparative Example 4

The same procedures used in Example 1 were repeated except for using a slurry obtained by mixing 20 parts of PBO chopped fibers having a fiber length of 3.0 mm and 80 parts of PBO pulp (available from Toyobo Co., Ltd.) to thus give a final non-woven fabric.

The non-woven fabrics prepared in Examples and Comparative Examples were evaluated for a variety of characteristic properties. The results thus obtained are summarized in the following Table 1. As will be clear from the data shown in Table 1, the non-woven fabric prepared from the flat PBO fibers of the present invention has good working properties and an improved strength as compared with the non-woven fabric prepared from the usual PBO chopped fibers each having a circular cross section.

TABLE 1

| Ex. No. | | 1 | 2 | 1* | 2* | 3* | 4* |
|---|---|---|---|---|---|---|---|
| Short Diameter of Fiber, μm | | 2.3 | 6.2 | 7.6 | 11.5 | — | — |
| Degree of Flatness | | 19.8 | 2.8 | 1.8 | 1.0 | — | — |
| <Quality of Non-woven Fabric> Basis Weight, g/m² | | 25.0 | 25.0 | 25.0 | 25.0 | 25.0 | 25.0 |
| Tensile Strength, kgf/30 mm | | 4.7 | 5.2 | 4.5 | 3.5 | 4.2 | 2.0 |
| Formation | | ○ | ○ | Δ | X | Δ | Δ |
| Working Characteristics | 100 m | ○ | ○ | ○ | ○ | ○ | ○ |
| | 200 m | ○ | ○ | ○ | Δ | ○ | ○ |
| | 300 m | ○ | ○ | Δ | Δ | Δ | ○ |
| | 400 m | ○ | ○ | Δ | X | Δ | Δ |
| | 500 m | ○ | ○ | X | X | X | Δ |
| | Overall Evaluation | ○ | ○ | X | X | X | Δ |

*Comparative Example

As has been described above, the flat PBO fiber of the present invention is a fiber suitably used for preparing, for instance, heat-resistant non-woven fabrics, resin- reinforcing materials and friction materials. In particular, the flat PBO fiber of the present invention is excellent in the tensile strength and working characteristics observed when it is used for the production of a non-woven fabric, as compared with those observed for the usual PBO fiber having a circular cross section. In addition, the preparation method of the present invention permits simple, efficient preparation of the foregoing flat PBO fiber at low cost.

Example 3

PBO Chopped fibers (trade name: ZYLON HM, fiber diameter: 1.5 d, available from Toyobo Co., Ltd.) having a length of 3.0 mm and a circular cross section were dispersed in water to form a slurry having a solid content of 0.3%. Then, the slurry was introduced into a 1400 ml volume horizontal sand mill (DYNO-MILL TYPE KDL-PILOT, available from SHINMARU Enterprises), to which alumina beads having an average particle size of 2 mm had been charged in a packing rate of 50% (with respect to the closest packing amount), at a flow rate of 350 ml/min (retention time: 2.6 min) to thus treat the slurry at a rotational frequency of 2400 rpm. At this stage, the processing temperature was set at a level of 30° C. by adjusting the temperature of the circulating water for cooling. As a result, it was found that the fiber obtained after the treatment had a Wmax/Wmin ratio of 2.42; the Wmax/Wav ratio equal to 2.42; the ratio of L2/L1 equal to 0.15; and the fiber length was found to be 3 mm.

The PBO fibers obtained after the sand mill treatment were formed into a sheet according to a wet method using a square type paper-making machine in such a manner that the basis weight of the sheet was equal to 20 g/m². An emulsion of a thermosetting epoxy resin was added to this sheet according to the spraying method such that the content thereof in the resulting non-woven fabric after drying the same was equal to 20%, followed by drying the same by heating to give a non-woven fabric having a basis weight of 25 g/m².

Then, the resulting non-woven fabric was subjected to calendering treatment using a hot calender having a roll temperature of 200° C. such that the density of the non-woven fabric after the calendering was reduced to a level of 0.6 g/cm³. The resulting non-woven fabric was inspected for the strength and the results thus obtained are summarized in the following Table 2.

Example 4

The same procedures used in Example 3 were repeated except that the packing rate of the beads was changed to 45% and that the rotational frequency was changed to 1910 rpm (peripheral speed: 10.0 m/sec) to thus form a fiber and a non-woven fabric. As a result, it was found that the fiber obtained after the treatment had a Wmax/Wmin ratio of 2.33; the Wmax/Wav ratio equal to 2.33; the ratio of L2/L1 equal to 0.05; and the fiber length of 3 mm.

The results obtained when the non-woven fabric was prepared by repeating the same procedures used in Example 1 are listed in Table 2.

Example 5

The same procedures used in Example 3 were repeated except that the packing rate of the beads was changed to 60% to thus form a fiber and a non-woven fabric. As a result, it was found that the fiber obtained after the treatment had a Wmax/Wmin value of 3.23; the Wmax/Wav value equal to 1.83; the value: L2/L1 equal to 0.5; and the fiber length of 3 mm.

The results obtained when the non-woven fabric was the prepared by repeating the same procedures used in Example 3 are listed in Table 2.

Comparative Example 5

A non-woven fabric was prepared by repeating the same procedures used in Example 3 except that fibers were not subjected to any sand mill-treatment. It was found that the fiber obtained after the treatment had a Wmax/Wmin ratio of 1.00; the Wmax/Wav ratio equal to 1.00: the ratio of L2/L1 equal to 0; and the fiber length was 3 mm.

The results obtained when the non-woven fabric was prepared by repeating the same procedures used in Example 3 are listed in Table 2.

TABLE 2

| Ex. No. | 3 | 4 | 5 | 5* |
|---|---|---|---|---|
| Wmax ($\mu$m) | 29 | 28 | 42 | 12 |
| Wmin ($\mu$m) | 12 | 12 | 13 | 12 |
| Wav ($\mu$m) | 12 | 12 | 23 | 12 |
| Flattening Rate | 0.15 | 0.05 | 0.5 | 0 |
| Basis Weight (g/m²) | 25 | 25 | 25 | 25 |
| Density (g/cm³) | 0.6 | 0.6 | 0.6 | 0.6 |
| Tensile Strength (kgf/30 mm) | 10.9 | 6.5 | 9.5 | 5.1 |
| Formation | ◯ | Δ | ◯ | X |

*Comparative Example

As will be seen from the data listed in Table 2, the non-woven fabric prepared using the partially flat fibers according to the present invention has a high strength as compared with that observed for the non-woven fabric prepared using the fibers prior to the partial flattening treatment.

As has been discussed above in detail, the flat fiber according to the present invention is suitably used as a material for preparing a high strength non-woven fabric and the tensile strength observed when the fibers are formed into a non-woven fabric is markedly improved as compared with the usual fibers. Moreover, the preparation method of the present invention permits the simple and efficient preparation of the foregoing partially flattened fibers.

What is claimed is:

1. A flat polybenzazole fiber having a flattened portion having a degree of flatness defined by the ratio of the long diameter/the short diameter of the cross section of the fiber being 2 or higher and having a short diameter being 7 $\mu$m or less.

2. The fiber of claim 1 wherein said degree of flatness fiber is 5 or higher.

3. The fiber of claim 1 wherein said short diameter is 5 $\mu$m or less.

4. The fiber of claims 1 wherein said flattened portion is formed through said fiber in the longitudinal direction thereof.

5. The fiber of claim 1 wherein said flat portion is partially formed along the longitudinal direction thereof.

6. The fiber of claim 1, wherein said polybenzazole fiber is poly(p-phenylene-benzobisoxazole) fiber.

7. A non-woven fabric comprising the flat polybenzazole fiber of claim 1.

8. The non-woven fabric of claim 7 which is impregnated with a resin binder.

9. The non-woven fabric of claim 7, wherein said polybenzazole fiber is poly(p-phenylene-benzobisoxazole) fiber.

10. A method for preparing the flat polybenzazole fiber of claim 1, comprising the steps of subjecting a polybenzazole fiber to a sand mill and recovering the flat polybenzazole fiber.

11. The method of claim 10, wherein said polybenzazole fiber is poly(p-phenylene-benzobisoxazole) fiber.

12. A partially flat synthetic fiber having a flattened portion along the longitudinal direction of said fiber, wherein the maximum fiber width of the flattened portion (Wmax) and the narrowest fiber width of said synthetic fiber (Wmin) has the ratio of Wmax/Wmin being 2 or higher.

13. The partially flat synthetic fiber of claim 12, wherein said Wmax/Wmin is 2.5 or higher.

14. A partially flat synthetic fiber having a flattened portion along the longitudinal direction of said fiber, wherein the maximum width of the flattened portion (Wmax) and the average fiber width in the lengthwise direction of said synthetic fiber (Wav) has the ratio of Wmax/Wav being 1.5 or higher.

15. The partially flat synthetic fiber of claim 14, wherein said Wmax/Wav is 2 or higher.

16. The partially flat synthetic fiber of claim 12 or 14, wherein the overall fiber length (L1) and the total length of the flattened portion (L2) has a flattening rate of L1/L2 ranging from 0.05 to 0.5.

17. The partially flat synthetic fiber of claim 12 or 14, wherein said synthetic fiber has no self fusion-bonding ability or self-adhering ability.

18. The partially flat synthetic fiber of claim 12 or 14, wherein said synthetic fiber is selected from the group consisting of para-type aromatic polyamide fibers and polybenzazole fibers.

19. A method for preparing the partially flat synthetic fiber of claim 12 or 14, comprising the steps of subjecting a synthetic fiber to a sand mill and recovering the partially flat synthetic fiber.

20. A non-woven fabric comprising the partially flat synthetic fiber of claim 12 or 14.

* * * * *